Aug. 28, 1951

M. G. NICHOLSON, JR 2,565,876

SIGNAL-SEEKING RECEIVER FOR FREQUENCY MODULATED SIGNALS

Filed Aug. 8, 1945

INVENTOR
Madison G. Nicholson, Jr.
BY C. G. Norton
ATTORNEY

Patented Aug. 28, 1951 2,565,876

UNITED STATES PATENT OFFICE 2,565,876

SIGNAL-SEEKING RECEIVER FOR FREQUENCY-MODULATED SIGNALS

Madison G. Nicholson, Jr., Snyder, N. Y., assignor, by mesne assignments, to Sylvania Electric Products Inc., New York, N. Y., a corporation of Massachusetts Application August 8, 1945, Serial No. 609,575

4 Claims. (Cl. 250—20)

Figures 1, 2, 3:
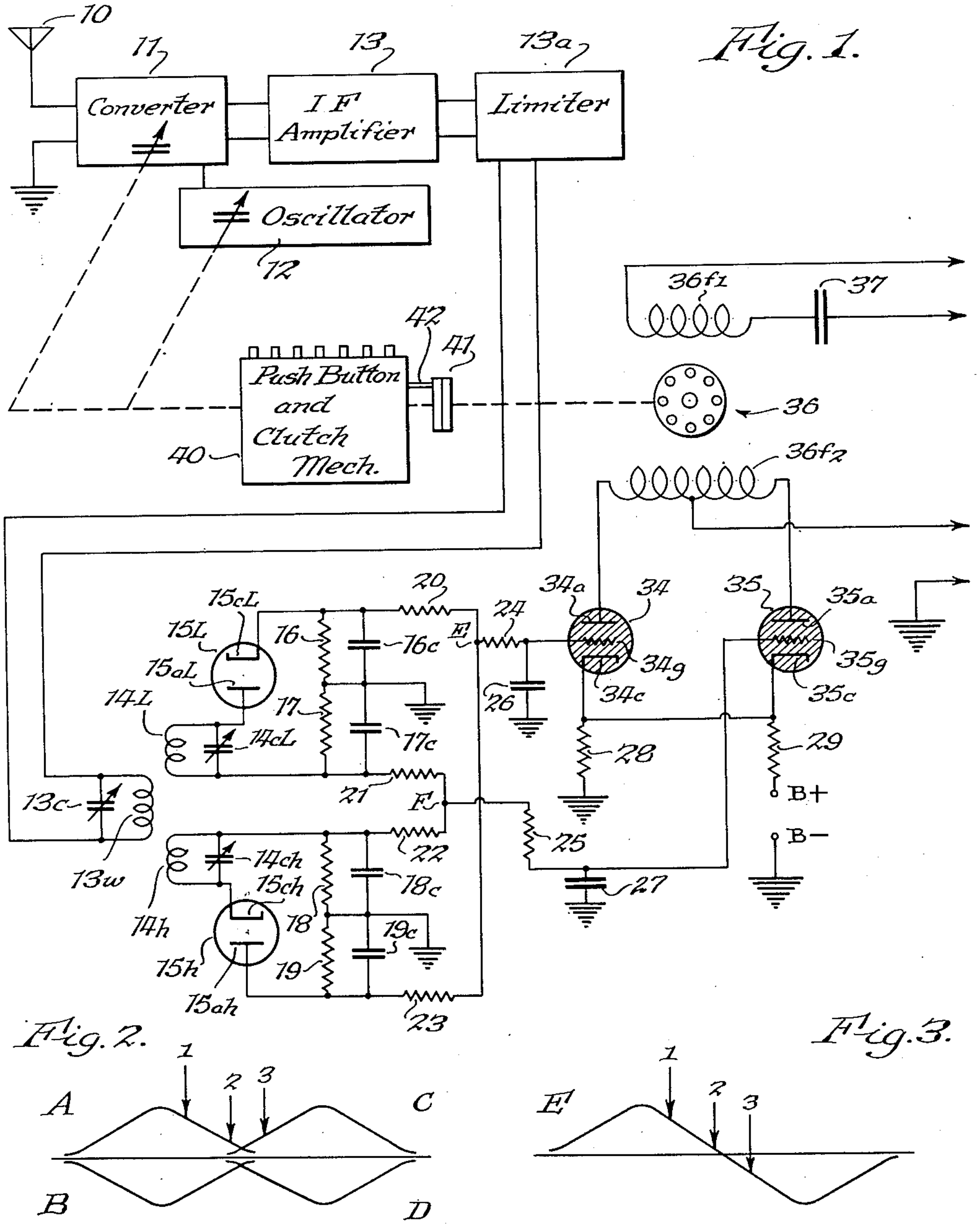

This invention relates to signal-seeking receivers for frequency modulated waves, and more particularly to such a receiver arranged for push button tuning so that the operator can select a desired station by the pushing of a button allocated to such station, but in which the final tuning adjustment of the receiver is independent of mechanical parts, such as cams, rocker bars, and so on, and is determined by the incoming signal itself, the receiver being stopped in the position in which the receiver is best tuned to the desired signal.

This application is a continuation in part of my co-pending application, Serial No. 563,117, now Patent No. 2,478,977, patented August 16, 1949, filed November 13, 1944, for Signal-Seeking Receiver for Frequency Modulated Signals.

A signal-seeking receiver, as the term is used herein, means a receiver in which the tuning instrumentality is motor driven, and in which it is stopped by the receiver itself when a signal is tuned in, without any action by the operator.

Such receivers are not difficult to construct for operation on amplitude modulated signals, and will operate very satisfactorily. However, if it is attempted to use such receivers for tuning in frequency modulated signals (assuming the receiver is capable of receiving them), a great difficulty immediately becomes manifest. In amplitude modulated signals the carrier frequency remains constant, and since it is the action of the carrier frequency which halts the tuning change, a signal-seeking receiver will tune itself very exactly to amplitude modulated signals.

In frequency modulated signals, as is well known, the carrier is constantly changing in frequency when the signal is being modulated, shifting at a rate determined by the modulating frequency and by an amount determined by the intensity of the modulating sound. For 100% modulation in so-called wide swing frequency modulation systems the carrier may deviate or swing as much as 75 kc. on either side of the mean.

It is well known that accurate tuning is of vital importance in frequency modulation receivers. Unless the receiver is tuned very exactly to the mean carrier frequency, unbearable distortion and noise will be introduced, and it is generally true that the greater the degree of mistuning, the greater the distortion and noise. From this it will be appreciated that the problem of providing a signal-seeking receiver which will stop exactly on the mean carrier is very complex.

The use of maximum current in a simple resonant circuit does not lend itself to a solution, because, supposing the resonant circuit to be approaching the mean carrier frequency as its tuning changes, if the carrier happens to be swinging at the time the tuning of the resonant circuit happens to come into the range of the carrier, it is a mere matter of chance at what frequency within the deviation range the circuit will stop; and since the frequency range over which the signal is receivable is much greater than the range over which it is receivable without noise and distortion, it is apparent that the chances of stopping in the correct range are comparatively small.

In my prior application above mentioned, I have provided circuits arranged so that the receiver will stop and remain exactly at the mean frequency within the tolerance for which the apparatus is constructed, and if it should by any change overshoot the correct tuning position and tend to stop in an incorrect position, it will, without any attention on the part of the operator, correct itself and return to the correct position. Also, if thermal drift occurs, causing mistuning, the receiver will retune itself, correcting for the drift. This is done, not by mechanical adjustments of stops in predetermined position, but by the signal itself, according to the signal-seeking principle.

In my earlier application the operation of the receiver is strictly signal-seeking; that is to say, the receiver tuning is set in motion by pushing a button, and the operator does not know, and has no control over, what station will be tuned in. For some purposes this is entirely satisfactory, but under other conditions it is desirable to be able to select a desired station to the exclusion of any other station which may be operating.

Thus, in metropolitan areas, there may be perhaps six or eight stations serving the area, to which the listener customarily listens, and his purposes are best served by a receiver which has, for example, eight push buttons, each one of which may be allocated to a particular station, and each one of which will cause reception of only the station to which it is allocated, if that station happens to be transmitting at the time the button is operated.

From the foregoing it will be understood that among the objects of my invention are the following:

To provide a signal-seeking receiver for frequency modulated signals which may be equipped with push buttons for tuning individual stations.

To provide such a receiver in which the operator can tune by push buttons from a station anywhere in the band to a desired station anywhere within the band, without stopping on intervening stations.

To provide such a receiver in which the major part of the travel of the tuning mechanism is under the control of the manual push button (this action I term "coarse tuning"), but in which the final, or what I term "fine tuning" is done by the receiver itself under the control of the incoming signal.

To provide such a receiver in which the necessity of a high degree of accuracy in the push button tuning mechanism is eliminated.

To provide such a receiver which requires no more than the pushing of a button and yet will tune the signal as accurately as, or more accurately than, it can be done by a skilled operator, and which does not involve excessively small tolerances in mechanical parts or a high degree of precision in the setting of cams, rocker bars, etc., and which is free from thermal drift effects.

Still other objects and advantages of my invention will be apparent from the specification.

Figure 4:
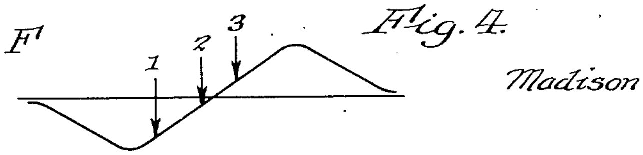

The features of novelty which I believe to be characteristic of my invention are set forth with particularity in the appended claims. My invention itself, however, both as to its fundamental principles and as to its particular embodiments, will best be understood by reference to the specification and accompanying drawing, in which Fig. 1 is a circuit diagram of a signal-seeking receiver in accordance with my invention, and Figs. 2, 3, and 4 are curves explaining the operation of my invention.

Referring more particularly to Fig. 1, the signals may be received on any suitable form of antenna 10 and then supplied to converter 11, in which the frequency is changed by interaction with oscillations generated by oscillator 12. The frequency modulated output of the converter may then be supplied to intermediate frequency amplifier 13, all as heretofore practiced. The output of intermediate frequency amplifier 13 may then be supplied to limiter 13*a*, and the output of this passed to the last intermediate frequency coil 13*w* tuned by condenser 13*c*.

The output from coil 13*w* is fed to a double frequency discriminator network comprising the upper portion made up of winding 14L shunted by tuning condenser 14*c*L, and this portion may be tuned to a desired frequency lower than the mean frequency by the desired amount.

Connected from one side of condenser 14*c*L I may provide diode 15L, having cathode 15*c*L and anode 15*a*L, and cathode 15*c*L may be connected through resistance 16 shunted by by-pass condenser 16*c* to ground. Similarly, in the other portion of the discriminator, inductance 14*h* may be shunted by tuning condenser 14*ch*, and this part of the discriminator may be tuned to another frequency differing from the mean frequency by the same amount as that of 14L, but on the high frequency side.

One side of condenser 14*ch* may be connected to the anode of diode 15*h*, having cathode 15*ch* and anode 15*ah*. Cathode 15*ch* may be connected to ground through resistance 19 shunted by by-pass condenser 19*c*. The opposite side of condenser 14*c*L may be connected to ground through resistance 17 shunted by by-pass condenser 17*c*, and the opposite side of condenser 14*ch* may be connected to ground through resistance 18 shunted by by-pass condenser 18*c*.

The high side of resistances 17 and 18 may be connected together through resistances 21 and 22 respectively, and the high side of resistances 16 and 19 may be connected together through resistances 20 and 23 respectively. The common point of resistances 20 and 23 may be connected through resistance 24 to the control electrode of thyratron 34, having cathode 34*c*, control electrode 34*g*, and anode 34*a*; and by-pass condenser 26 may be connected from control electrode 34*g* to ground.

The common point of resistances 21 and 22 may be connected through resistance 25 to the control electrode of another thyratron 35, having cathode 35*c*, control electrode 35*g*, and anode 35*a*. Cathodes 34*c* and 35*c* may be connected together and to ground through resistance 28, and also through resistance 29 to B+ and from B− to ground.

The tuner motor is indicated as at 36, and may have its shaft coupled to the tuning instrumentalities controlling the receiver, diagrammatically indicated as a tuning condenser in converter 11 and one in oscillator 12 ganged together. For operation of the tuning instrumentality, I may provide push button and clutch mechanism 40, having a series of individual station push buttons, and these may employ the well known tilt bar construction, such as shown, for instance, in patent to McGarvey, 2,372,099, more particularly Figs. 12 and 13.

Clutch mechanism 41 may be interposed between the push button mechanism and tuner motor 36 in such a manner that while any push button is depressed, tuner motor 36 is declutched from the tuner shaft by clutch 41, operated by connection 42. The McGarvey patent above referred to shows such a construction, except that the clutch disengages the tuning shaft from the manual tuning knob when a selector button is pushed, but it will be understood that such mechanism may be used for the purpose of disengaging the tuner shaft from motor 36 while any button or push button mechanism 40 is depressed.

The tuner motor may be a reversible induction motor of the capacitor type, having one winding 36*f*1 which may be connected through condenser 37 to an alternating current source; for instance, the house line of 115 volts, 60 cycles. The action of the capacitor 37 is to cause a substantial phase shift in the current flowing through the field 36*f*1.

If, now, the other winding 36*f*2 be connected across the same source, a current will flow through it, but this current will be displaced in phase relation to that in field 36*f*1 by substantially 90°. Thus the action obtainable is the same as that in a two-phase induction motor, with the direction of rotation being determined by whichever of the two possible phase connections is used; reversal of the connection of one field, of course, causes reversal of the direction of rotation of the motor.

If, however, winding 36*f*2 is center-tapped with the tap connected to one side of the power source, then the direction of rotation is determined by which of the two ends of the winding is connected to the other side of the power source. Opposite ends of winding 36*f*2 may be connected to anodes 34*a* and 35*a* of thyratrons 34 and 35 and the mid-point of winding 36*f*2 connected to a point on the same source, which may have a voltage of approximately 300 volts at 60 cycles. It will now be understood that the direction of rotation of the tuner motor will be dependent upon which of the thyratrons is ionized.

At this point it may be noted that, while in ordinary thyratron operation, once the tube fires, it stays ionized until the plate circuit is opened, in the present case, since the plates are fed with alternating current, neither thyratron, if fired, will remain fired for a complete cycle, but each will fire for one-half cycle if the control electrode voltage permits it, and will be extinguished in any event at the end of such half cycle.

The operation of the receiver as a signal-seeking receiver for frequency modulated signals will now be described. It will be noted that the discriminator herein has two output circuits, one for each thyratron. The characteristic of each circuit is that of a typical balanced discriminator, each having the opposite polarity of the other. This is shown in Figs. 3 and 4, in which Fig. 3 represents the voltage at point E as applied to control electrode 34g of thyratron 34, and Fig. 4 represents the voltage at point F as applied to control electrode 35g of thyratron 35. While the output of each circuit is zero for exact tuning, for detuning in one direction the output of one circuit is positive while that of the other is negative, and for detuning in the opposite direction the polarities are likewise reversed.

The response of each circuit is about one-half of maximum when the signal is at center frequency. One diode rectifier is used to rectify the output of each circuit. Instead of a single diode load resistor for each diode, however, two load resistors of equal value are used, one from cathode to ground and one from anode to ground. For diode 15L these load resistors are 16 and 17; for diode 15h they are 18 and 19.

In this way there are obtained from each diode two equal outputs, one being positive with respect to ground and the other being negative. This is clearly shown in Fig. 2, in which curve A represents the voltage from cathode 15Lc to ground and that of curve B the voltage from the high side of resistor 17 to ground.

Similarly, curves C and D represent respectively the voltage from the high side of resistor 18 to ground and the voltage from cathode 15hc to ground. By adding outputs A and D by means of resistors 20 and 23 at point E, the curve E, Fig. 3, is obtained. Likewise by adding outputs B and C through resistors 21 and 22, the output at point F is obtained, as shown by curve F, Fig. 4. The voltages at points E and F are audio frequency voltages corresponding to the modulation, and either may be supplied to the audio amplifier and loud speaker (not shown) or since these voltages are of opposite phase, they may both be used to supply a push-pull audio amplifier.

The cathodes of the thyratrons are biased just enough so that the output of the discriminator will cause one thyratron to operate if the receiver is detuned by more than the desired tolerance. Since outputs E and F are opposite in polarity, only one of the two can be positive at any time. Thus only one of the thyratrons will operate when the receiver is detuned.

By connecting the motor electrically and mechanically so that detuning will cause the motor to drive the tuning mechanism in a direction toward the point of proper tuning, a signal may then be tuned in by the action of the discriminator, the thyratrons, and the tuner motor. It will be seen, however, that this action will not occur unless the receiver is tuned within the zones covered by curves E and F of Figs. 3 and 4.

In order to obtain this signal-seeking tuning action, it is necessary to tune the receiver into the zone where the signal-seeking action may occur. This may be accomplished by push button mechanism 40, in which the individual station selectors are adjusted to tune the receiver roughly or somewhere within the maximum + and − voltages from the discriminator output. This operation I term "coarse tuning."

During this operation; i. e., the manual actuation of a selector button, clutch mechanism 41 is operated by connection 42 and the motor is declutched from the tuner mechanism which is thereby set by the action of manual mechanism 40 within the fine tuning zone. As soon as this condition is reached and the operator withdraws his finger from the selector button, motor 36 is again clutched to the tuning shaft, and the "fine tuning" action occurs. Tuning motor 36 is now under the control of thyratrons 34 and 35, and these are in turn controlled by the output of the discriminator network.

Suppose, for instance, that at the conclusion of the manual operation the receiver is tuned to the frequency indicated by arrow 1 on curves 2, 3, and 4. It will be observed that a discriminator output voltage applied to thyratron 34 is positive, whereas that applied to thyratron 35 is negative.

Therefore, thyratron 34 will fire each half cycle, and the tuner motor will be set in operation in a direction to change the tuning from the frequency indicated by arrow 1 to the frequency indicated by arrow 2, at which time thyratron 34 will no longer continue to fire because of insufficient positive voltage on its control electrode, no current will flow in the tuner motor field, and the motor will, accordingly, come to rest.

If the inertia of the tuner motor is such as to carry it beyond the desired point to the frequency indicated by arrow 3, before this condition is reached, the voltage impressed on thyratron 35 has changed from negative to positive, as will be observed in Fig. 4, and that on thyratron 34 has changed from positive to negative, as indicated in Fig. 3.

As soon as thyratron 35 begins to fire on each half cycle, if motor 36 has not stopped rotating, the field currents passed by thyratron 35 will exert a braking action on it and will cause it to stop and finally to rotate in the opposite direction until it passes into the tolerance zone.

It will be apparent that, should the inertia of the motor be sufficiently great, a hunting action might occur, in which the motor would continue to rotate, first in one direction and then the other, swinging the tuned frequency continuously back and forth about the center frequency. To prevent this, it is desirable that the inertia of the parts be kept small so that excessive coasting after the cutoff of motor current occurs will not take place.

It will also be clear that once the system has tuned itself to the center frequency of the discriminator as described, excessive percentages of modulation will not cause the receiver to change its tuning to follow the carrier as it swings about the mean frequency, because any currents flowing through the motor, if integrated over a period long enough to overcome the motor inertia and cause rotation, will equal or closely approximate zero.

In this connection it may be noted that the RC combinations, resistance 24 and condenser 26, and resistance 25 and condenser 27, are preferably so chosen that modulation frequencies in the output of the discriminator are by-passed to ground and do not affect the tuning.

An interesting feature of my invention is that the circuit is substantially immune to the harmful effect of thermal drift of the oscillator frequency. As drift occurs, its result in the output of the discriminator is the same as mistuning. When it exceeds the tolerance limits of the circuit, one or the other of the thyratrons will begin to fire, and the motor will operate to the extent necessary to retune the receiver until the mean carrier frequency again has the desired value.

Consequently, it will be seen that the action of the circuit is that stated to be desired; that is, by pushing any one of the station buttons in push button mechanism 40, the receiver is tuned by what may be termed coarse tuning into the zone of fine tuning.

If, as will usually be the case, this tuning is not within the tolerance limits for best reproduction, the tuner motor will be set into operation and will rotate in the direction to bring the receiver tuning within the tolerance limits.

In the specification I have explained the principles of my invention and the best mode in which I have contemplated applying those principles, so as to distinguish my invention from other inventions; and I have particularly pointed out and distinctly claimed the part, improvement, or combination which I claim as my invention or discovery.

While I have shown and described certain preferred embodiments of my invention, it will be understood that modifications and changes may be made without departing from the spirit and scope thereof, as will be clear to those skilled in the art.

I claim:

1. Radio receiving apparatus comprising, in combination, means for receiving frequency modulated signals, including a variable movable tuning instrumentality for selecting the signal to be received, electric power operated means for moving said tuning instrumentality, a frequency discriminator-rectifier network supplied by received signals, and means operated by the received signal and responsive to the degree of detuning of said received signal within the operating frequency range of the frequency discriminator-rectifier network for correcting said detuning, said last mentioned means comprising a pair of thyratrons for causing operation of said power operated means in opposite directions, and means for applying a firing control voltage of opposite polarity derived from the output of said frequency discriminator-rectifier network to each of said thyratrons respectively, and a plurality of manually actuatable operators for moving said tuning instrumentality, each respectively presettable to move said tuning instrumentality into position for coarsely tuning the station for which said operator has been preset, a clutch interposed between said electric power operated means and said tuning instrumentality, and means for declutching said electric power operated means and said tuning instrumentality during actuation of each of said operators.

2. Radio receiving apparatus comprising, in combination, means for receiving frequency modulated signals, including a variable movable tuning instrumentality for selecting the signal to be received, electric power operated means for moving said tuning instrumentality, a frequency discriminator-rectifier network supplied by received signals, means operated by the received signal and responsive to the degree of detuning of said received signal within the operating frequency range of the frequency discriminator-rectifier network for correcting said detuning, a pair of thyratrons for causing operation of said power operated means in opposite directions, and means for applying a firing control voltage of opposite polarity derived from the output of said frequency discriminator-rectifier network to each of said thyratrons respectively, and a plurality of manually actuatable operators for moving said tuning instrumentality, each respectively presettable to move said tuning instrumentality into position for coarsely tuning the station for which said operator has been preset, a clutch interposed between said electric power operated means and said tuning instrumentality, and means for declutching said electric power operated means and said tuning instrumentality during actuation of each of said operators.

3. Radio receiving apparatus comprising, in combination, means for receiving frequency modulated signals, including a variable movable tuning instrumentality for selecting the signal to be received, an electric motor for moving said tuning instrumentality in opposite directions, a frequency discriminator-rectifier network supplied by received signals, means operated by the received signal and responsive to the degree of detuning of said received signal within the operating frequency range of the frequency discriminator-rectifier network for correcting said detuning, said means being responsive both in direction and magnitude to the degree of detuning of the carrier within the operating frequency range of the frequency discriminator-rectifier network, means for preventing response of said power operated means to carrier deviations caused by modulation, and a plurality of manually actuatable operators for moving said tuning instrumentality, each respectively presettable to move said tuning instrumentality into position for coarsely tuning the station for which said operator has been preset, a clutch interposed between said electric power operated means and said tuning instrumentality, and means for declutching said electric power operated means and said tuning instrumentality during actuation of each of said operators.

4. Radio receiving apparatus comprising, in combination, means for receiving frequency modulated signals, including a variable movable tuning instrumentality for selecting the signal to be received, electric power operated means for moving said tuning instrumentality, and means responsive for starting said power operated means, and means responsive to received signals for stopping variation of said tuning instrumentality when a frequency modulated signal of predetermined strength is tuned in, said last mentioned means comprising a discriminator, a pair of thyratrons controlled by the output of said discriminator for causing operation of said power means in opposite directions, said power means comprising a pair of windings for operating said power means in opposite directions, each of said pair of windings being supplied by one of said thyratrons, and a plurality of manually actuatable operators for moving said tuning instrumentality, each respectively presettable to move said tuning instrumentality into position for coarsely tuning the station for which said operator has been preset, a clutch interposed between said electric power operated means and said tuning instrumentality, and means for declutching said electric power operated means and said tuning instrumentality during actuation of each of said operators.

MADISON G. NICHOLSON, JR.

REFERENCES CITED

The following references are of record in the file of this patent:

UNITED STATES PATENTS

| Number | Name | Date |
|---|---|---|
| 1,642,173 | Round | Sept. 13, 1927 |
| 1,944,315 | Clapp | Jan. 23, 1934 |
| 2,020,275 | Beers | Nov. 5, 1935 |
| 2,190,319 | Koch | Feb. 13, 1940 |
| 2,193,843 | Robinson | Mar. 19, 1940 |
| 2,210,425 | Newman | Aug. 6, 1940 |
| 2,372,099 | McCarvey | Mar. 20, 1941 |
| 2,379,689 | Crosby | July 3, 1945 |
| 2,429,771 | Roberts | Oct. 28, 1947 |
| 2,476,849 | Ergen | July 19, 1949 |